(12) United States Patent
Gudeman et al.

(10) Patent No.: US 9,162,878 B2
(45) Date of Patent: Oct. 20, 2015

(54) WAFER LEVEL HERMETIC BOND USING METAL ALLOY WITH RAISED FEATURE AND WETTING LAYER

(71) Applicant: Innovative Micro Technology, Goleta, CA (US)

(72) Inventors: Christopher S Gudeman, Lompoc, CA (US); Prosenjit Sen, Bangalore, IN (US)

(73) Assignee: Innovative Micro Technology, Goleta, CA (US)

( * ) Notice: Subject to any disclaimer, the term of this patent is extended or adjusted under 35 U.S.C. 154(b) by 40 days.

(21) Appl. No.: 14/194,794

(22) Filed: Mar. 2, 2014

(65) Prior Publication Data

US 2015/0266726 A1 Sep. 24, 2015

Related U.S. Application Data

(60) Provisional application No. 61/851,117, filed on Mar. 4, 2013.

(51) Int. Cl.
*H01L 21/56* (2006.01)
*B81C 1/00* (2006.01)

(52) U.S. Cl.
CPC ......... *B81C 1/00269* (2013.01); *B81C 1/00849* (2013.01)

(58) Field of Classification Search
USPC ............. 438/18, 51, 106, 107, 125, 127, 455, 438/516
See application file for complete search history.

(56) References Cited

U.S. PATENT DOCUMENTS

| | | | |
|---|---|---|---|
| 5,534,466 A | 7/1996 | Perfecto et al. | |
| 6,407,345 B1 | 6/2002 | Hirose et al. | |
| 6,486,425 B2 | 11/2002 | Seki | |
| 6,524,649 B1* | 2/2003 | Sher et al. ................. | 427/207.1 |
| 6,528,874 B1 | 3/2003 | Ijjima et al. | |
| 6,580,138 B1 | 6/2003 | Kubena | |
| 6,746,891 B2 | 6/2004 | Cunningham et al. | |
| 6,818,464 B2 | 11/2004 | Heschel | |
| 6,876,482 B2 | 4/2005 | DeReus | |
| 6,917,086 B2 | 7/2005 | Cunningham et al. | |
| 2002/0113296 A1* | 8/2002 | Cho et al. ...................... | 257/659 |
| 2002/0179921 A1 | 12/2002 | Cohn et al. | |
| 2003/0104651 A1 | 6/2003 | Kim et al. | |
| 2005/0093134 A1 | 5/2005 | Tarn | |
| 2005/0168306 A1 | 8/2005 | Cohn et al. | |
| 2005/0250253 A1 | 11/2005 | Cheung et al. | |
| 2006/0125084 A1 | 6/2006 | Fazzio et al. | |
| 2007/0048898 A1 | 3/2007 | Carlson et al. | |
| 2008/0079129 A1 | 4/2008 | Foster et al. | |

(Continued)

*Primary Examiner* — Duy T Nguyen
*Assistant Examiner* — Bo Bin Jang
(74) *Attorney, Agent, or Firm* — Jaquelin K. Spong

(57) ABSTRACT

Systems and methods for forming an encapsulated device include a substantially hermetic seal which seals a device in an environment between two substrates. The substantially hermetic seal is formed by an alloy of two metal layers, one having a lower melting temperature than the other. The metal layers may be deposited two substrates, along with a raised feature formed under at least one of the metal layers. The two metals may form an alloy of a predefined stoichiometry in at least two locations on either side of the midpoint of the raised feature. The formation of the alloy may be improved by the use of an organic wetting layer adjacent to the lower melting temperature metal. Design guidelines are set forth for reducing or eliminating the leakage of molten metal into the areas adjacent to the bondlines.

20 Claims, 17 Drawing Sheets

(56) References Cited

U.S. PATENT DOCUMENTS

2010/0003772 A1\* 1/2010 Carlson et al. ............... 438/18
2012/0319303 A1 12/2012 Foster et al.

\* cited by examiner

WAFER LEVEL HERMETIC BOND USING METAL ALLOY WITH RAISED FEATURE AND WETTING LAYER

CROSS REFERENCE TO RELATED APPLICATIONS

This US Patent Application claims priority to U.S. Provisional Patent Application Ser. No. 61/851,117, filed Mar. 4, 2013, which is incorporated by reference in its entirety. This application is related to U.S. patent application Ser. No. 13/573,201, filed Aug. 30, 2012 and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to the sealing of microelectromechanical systems (MEMS) devices in an enclosure and the method of manufacture of the sealed enclosure. In particular, this invention relates to the formation of a hermetic seal between a fabrication wafer supporting the MEMS devices, and a lid wafer.

Microelectromechanical systems (MEMS) are devices often having moveable components which are manufactured using lithographic fabrication processes developed for producing semiconductor electronic devices. Because the manufacturing processes are lithographic, MEMS devices may be batch fabricated in very small sizes. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) device wafers, which are a relatively thick silicon "handle" wafer with a thin silicon dioxide insulating layer, followed by a relatively thin silicon "device" layer. In the MEMS switches, a thin cantilevered beam of silicon is etched into the silicon device layer, and a cavity is created adjacent to the cantilevered beam, typically by etching the thin silicon dioxide layer to allow for the electrostatic deflection of the beam. Electrodes provided above or below the beam may provide the voltage potential which produces the attractive (or repulsive) force to the cantilevered beam, causing it to deflect within the cavity.

Because the MEMS devices often have moveable components, such as the cantilevered beam, they typically require protection of the moveable portions by sealing the devices in a protective cap or lid wafer, to form a device cavity. The lid wafer may be secured to the device wafer by some adhesive means, such as a low outgassing epoxy. FIG. 1 shows an embodiment of an exemplary epoxy bond in a MEMS assembly 1. To achieve the epoxy bond, a layer of epoxy 20 is deposited on a cap or lid wafer 10, or on the fabrication wafer 30, around the perimeter of the MEMS device 34. The assembly 1 is then heated or the epoxy otherwise cured with wafer 10 pressed against the fabrication wafer 30, until a bond is formed between the cap or lid wafer 10 and the fabrication wafer 30. The bond forms a device cavity 40 which surrounds the MEMS device 34. The assembly 1 may then be diced to separate the individual MEMS devices 34.

SUMMARY

However, the epoxy bond may not be hermetic, such that the gas with which the MEMS device is initially surrounded during fabrication, escapes over time and may be replaced by ambient air. In particular, if the MEMS device is an electrostatic MEMS switch is intended to handle relatively high voltages, such as those associated with telephone signals, the voltages may exceed, for example, about 400 V. For these relatively high voltages, it may be desirable to seal the electrostatic MEMS switch in a high dielectric strength environment, for example, an electrically insulating gas environment, to discourage breakdown of the air and arcing between the high voltage lines. To this end, it may be desirable to seal a high dielectric strength gas or electrically insulating environment such as sulphur hexafluoride ($SF_6$), helium (He) or a freon such as $CCl_2F_2$ or $C_2Cl_2F_4$ within the device cavity. The gas may be chosen to be at least one of substantially thermally insulating and substantially electrically insulating. The insulating environment may also be vacuum or partial vacuum. In order to maintain the environment around the electrostatic MEMS switch, the seal needs to be hermetic, or at least substantially hermetic.

The systems and methods described here form a substantially hermetic seal between a device wafer and a cap or lid wafer. The seal construction may include an indium layer deposited over a gold layer. The gold and indium layers may be deposited by ion beam sputter deposition, by plating, or sputtering using a shadow mask to define the regions in which the gold and indium layers are to be deposited, for example. The gold and indium layers are then heated to a temperature beyond the melting point of the indium (156° C.). At this point, the indium melts into the gold and forms an alloy $AuIn_x$. The alloy $AuIn_x$ may have the stoichiometry $AuIn_2$, or it may be an eutectic alloy. The alloy may be impermeable to electrically insulating gases, or high dielectric permeability gases such as $SF_6$, and therefore may form a hermetic seal to contain such gases. Because indium melts at relatively low temperatures, the hermetic seal is formed at temperatures of only on the order of 150 degrees centigrade. The formation of the seal is therefore compatible with the presence of relatively vulnerable films, such as metal films, which would melt or volatilize at temperatures of several hundred degrees centigrade. The seal formation process also allows stacks of films of various materials (metals, dielectrics, polymers) to be present in the device. Such stacks tend to delaminate and lose functionality at even slightly elevated temperatures. Nonetheless, because the alloy is stable to several hundred degrees centigrade, the seal may maintain its integrity up to these temperatures.

The metal layer may be deposited over a rigid raised feature formed on the surface of one substrate, which in turn forms a raised region in the metal layer. This raised region then penetrates the opposing layer of the other metal deposited on the other substrate, thereby ensuring a region relatively rich in composition of metal of the raised feature. For example, if the raised feature is deposited first on the device wafer, followed by conformal deposition of a gold layer, the raised feature produces a corresponding raised feature in the deposited gold layer. When assembling the wafers, the gold protrusion penetrates into the molten layer of the lower melting point metal, here the indium metal, to produce a region which is rich in concentration of the gold. Adjacent to this region will be regions which are indium-rich/gold poor. Between these two regions will occur a region having nearly the exact desired relative concentration of the metals to form the preferred stoichiometry of the alloy.

The $AuIn_x$ alloy is an example of a class of bonding mechanisms known generally as solid/liquid interdiffusion bonds (SLID). These bonds generally make use of a lower melting temperature first component which forms a bond with a higher temperature solid second component. The bond is often a metallic alloy of a low melting temperature metal such as indium and the higher temperature metal such as gold. During the processing of these materials and before sealing, it is often desirable to clean the surfaces of the structures by heating the substrates before bonding them together. However, the ability to heat the components is limited because of the low melting temperature of the first component of the SLID bond. During this heating/cleaning step, the two components of the SLID bond may react and form the alloy prematurely, interfering with their ability to form the hermetic bond later when the wafers are bonded. The presence of the raised feature may also provide concave areas for the liquid component to pool, rather than flowing out across the wafer surface.

Described here is a method for improving the quality and uniformity of the SLID alloy, by using a wetting layer adjacent to the lower melting point metal of the SLID bonding material. The wetting layer has an affinity for the metal layer so that the surface is covered and further oxidation may be prevented. The wetting layer may also remove oxides and contaminants that arise from exposure of the metal to atmospheric conditions. It may also provide improved heat transfer between the materials, and thereby promote uniform alloying of the metals. Finally, the wetting layer may nearly or completely be driven from the surfaces during alloying or bonding, so that no residues remain to contaminate the device environment or compromise the hermeticity of the seal.

Accordingly, the method for encapsulating a device may include forming a first layer of a first metal on at least one of the first substrate and the second substrate, forming a second layer of a second metal adjacent to the first layer of the first metal, wherein the second metal has a lower melting point than the first metal. Then, the method may include forming at least one raised feature protruding from a bonding surface and into at least one of the first layer and the second layer, and forming a wetting layer of an organic material on at least one of a first substrate and a second substrate and adjacent to the lower melting point second metal. The substrates may be bonded by bonding the first substrate and the second substrate with a bondline of an alloy formed from the first metal and the second metal wherein the wetting layer is driven off at the temperature of alloy formation. The bondline may be at least substantially hermetic.

The method may further include heating the substrates so that the second layer is wetted by the wetting layer, then cleaning the second layer with the organic material, and finally bonding the first substrate and the second substrate with the alloy while driving off the wetting layer. The device may be at least one of an integrated circuit and a MEMS device encapsulated by a substantially hermetic bondline formed by the alloy.

In addition, design rules are given for choosing the appropriate quantities of the metal material, to reduce or eliminate the leakage of the liquid component of the SLID bond to the surrounding areas.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

In the systems and methods described here, a MEMS device is encapsulated with a cap or lid wafer. The MEMS device may have been previously formed on, for example, a silicon-on-insulator (SOI) composite substrate, or any other suitable substrate. The sealing mechanism may be a two-metal alloy, which bonds the silicon-on-insulator composite substrate with the cap or lid wafer. The two-metal alloy may have a melting point much higher than the melting point of at least one of the constituent elements, so that the alloy solidifies quickly upon formation. Accordingly, the bonding technology used here is a solid-liquid interdiffusion (SLID) bond. The alloy may form a substantially hermetic seal, preventing an enclosed gas from leaking out of the enclosed area of the MEMS device. Because the seal is a metal alloy seal, it may also provide electrical continuity between the cap or lid wafer and the device wafer.

Figure 10:
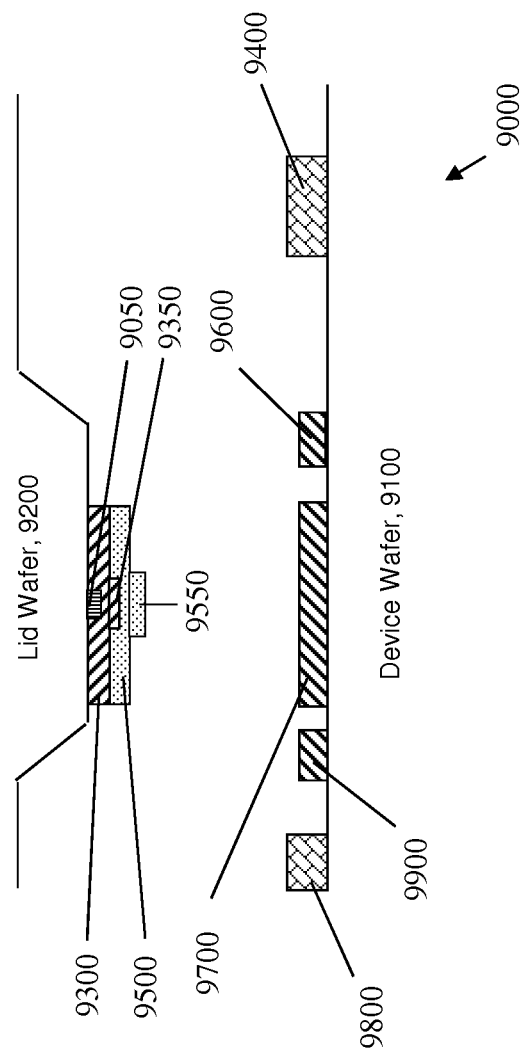
FIG. 10 is a cross sectional view showing a fourth embodiment of the wafer bond using two metal layers with a raised feature within the bondline on the lid wafer.
Figure 11:
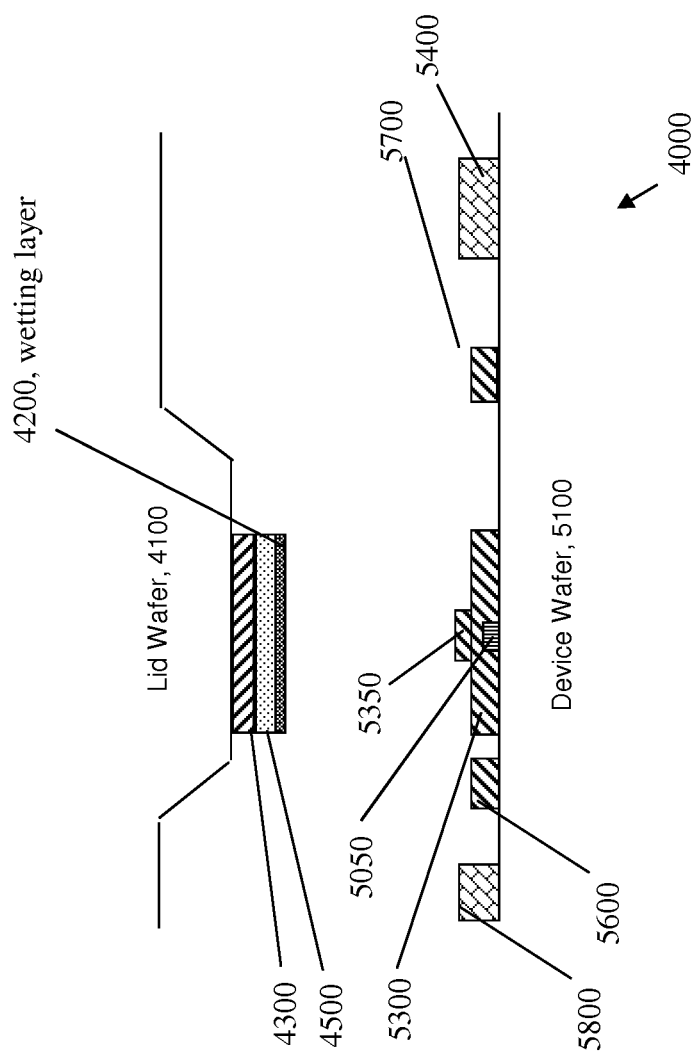
FIG. 11 is a cross sectional view showing an embodiment of the wafer bond using two metal layers and a wetting layer along with a raised feature within the bondline on the device wafer.
Figure 12:
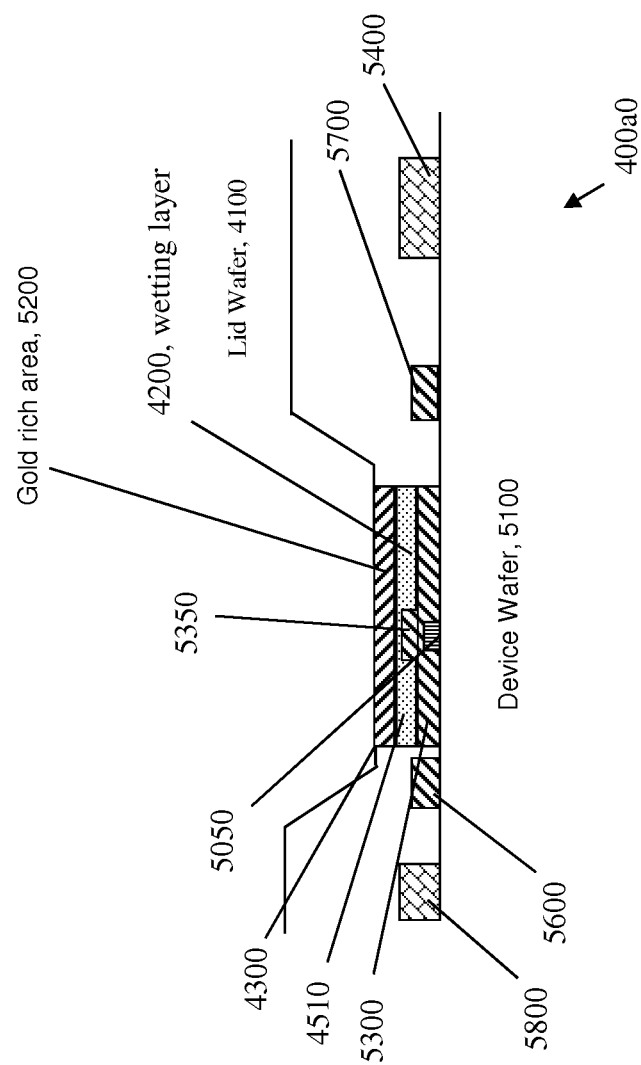
FIG. 12 is a cross sectional view showing an embodiment of the wafer bond using two metal layers and a wetting layer along with a raised feature within the bondline on the device wafer, after bonding.
Figure 13:
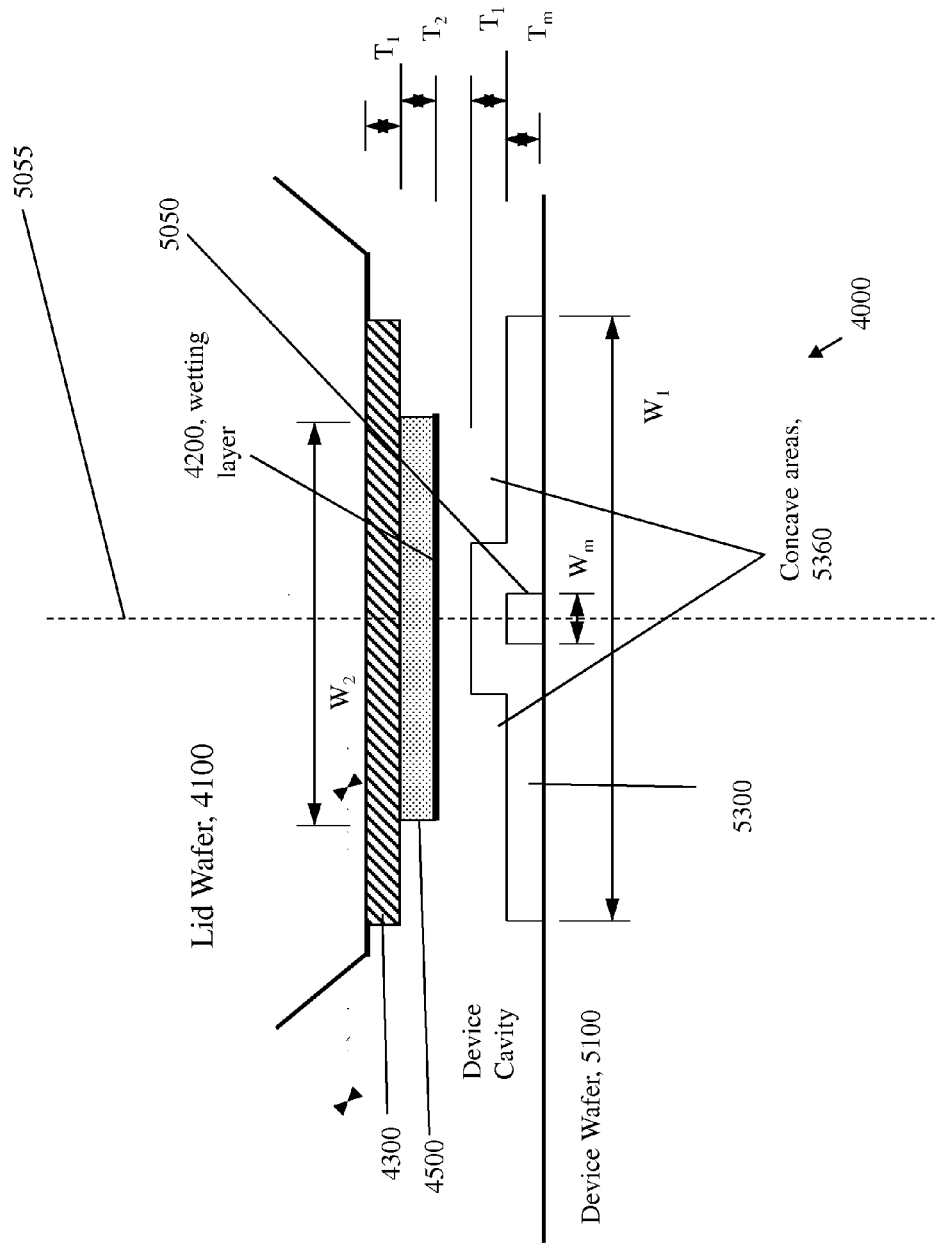
FIG. 13 is a cross sectional view showing an embodiment of the wafer bond using two metal layers with a raised feature with exemplary dimensions shown.
Figure 14:
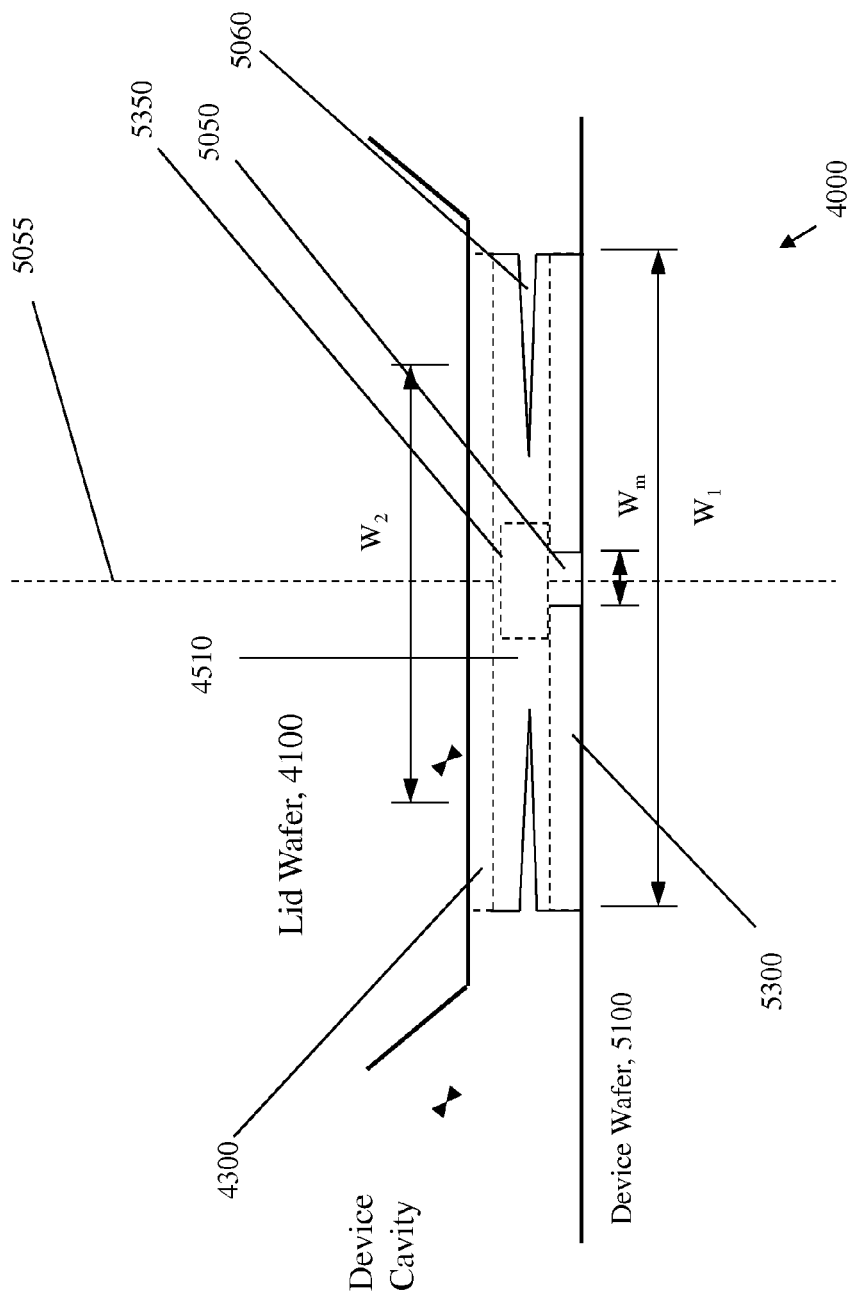
FIG. 14 is a cross sectional view showing an embodiment of the wafer bond using two metal layers and a raised feature within the bondline on the device wafer, showing the voids formed after bonding.
Figure 15:
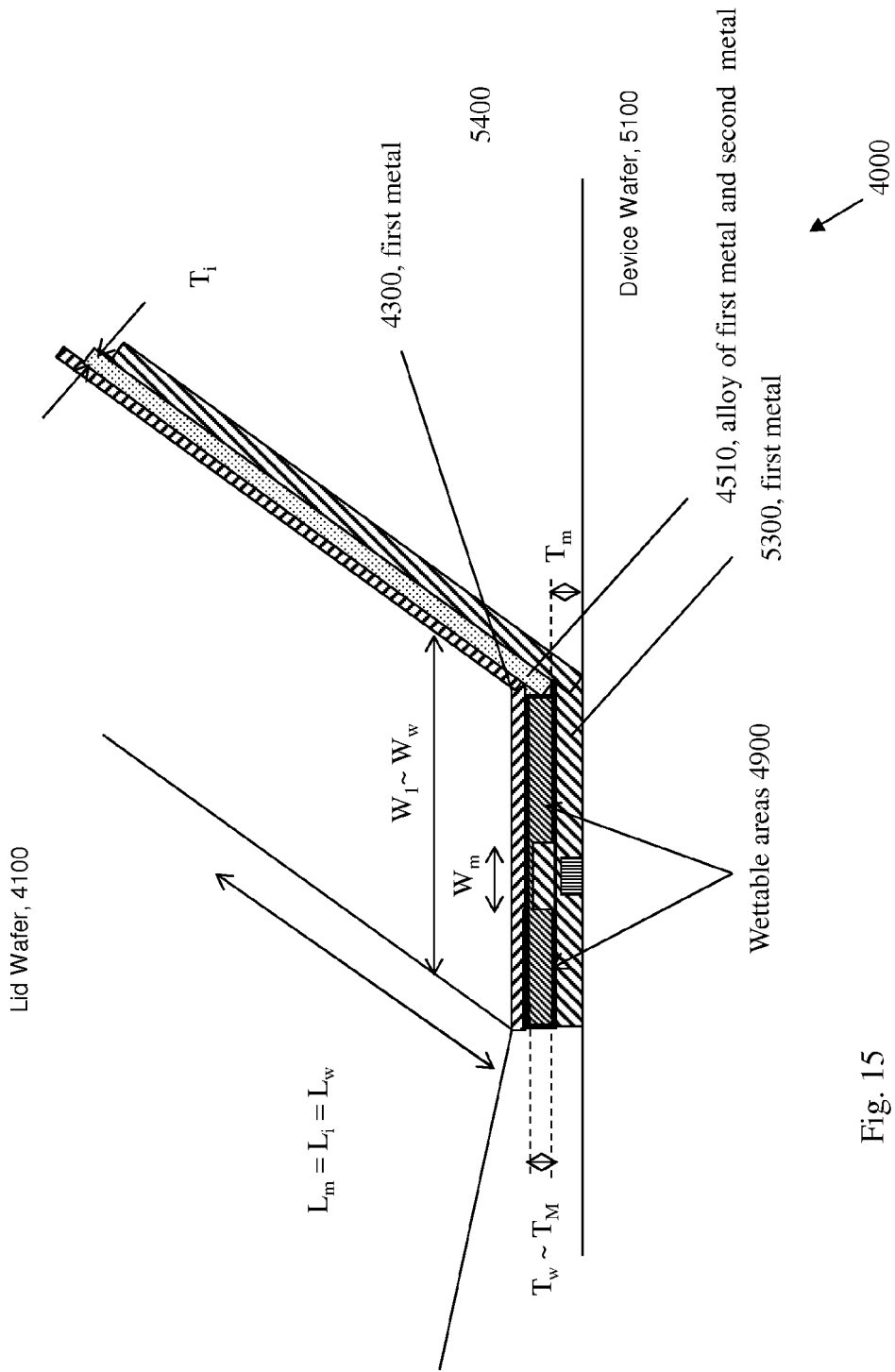
FIG. 15 is a perspective view showing an embodiment of the wafer bond using two metal layers and a raised feature showing the various dimensions of the various layers after bonding.
Figure 16:
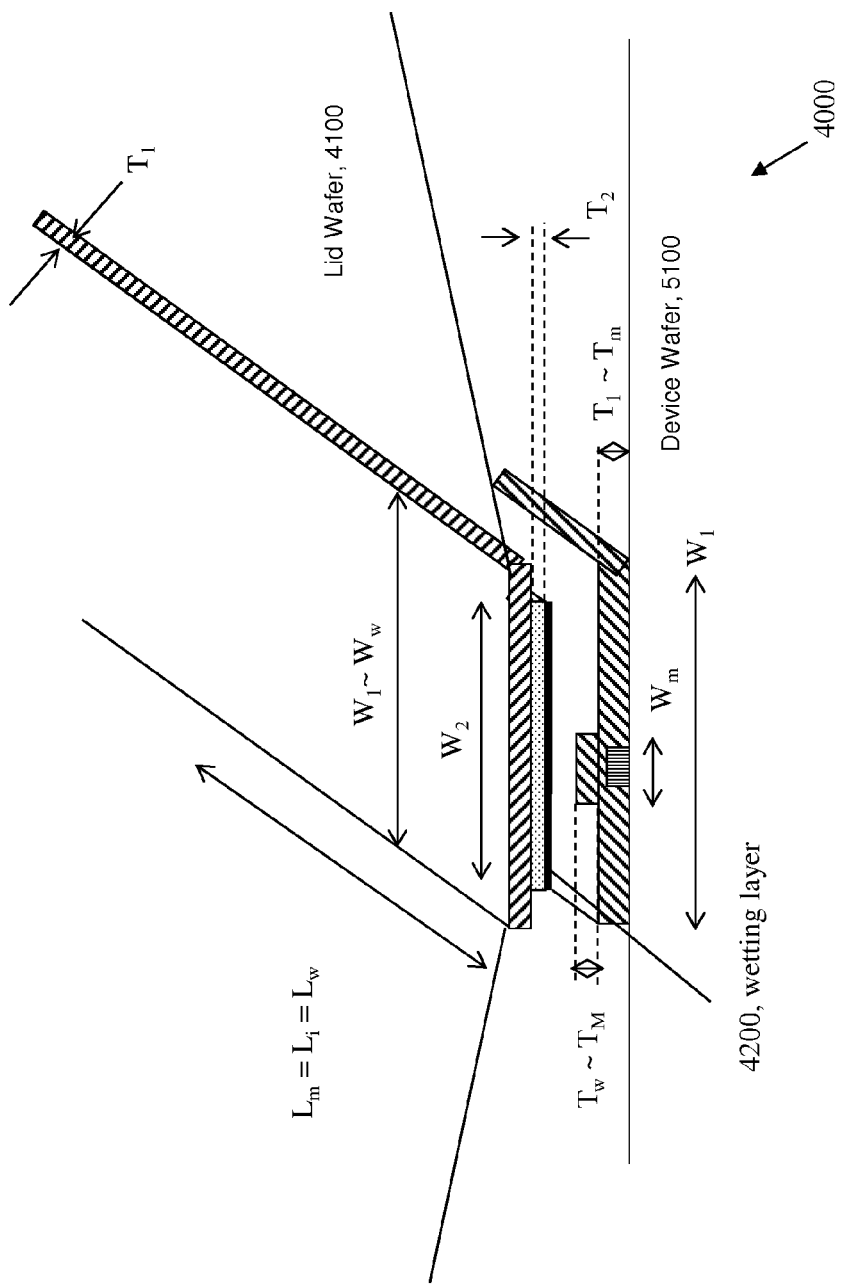
FIG. 16 is a perspective view showing an embodiment of the wafer bond using two metal layers and a raised feature showing the various dimensions of the various layers prior to bonding.
Figure 17:
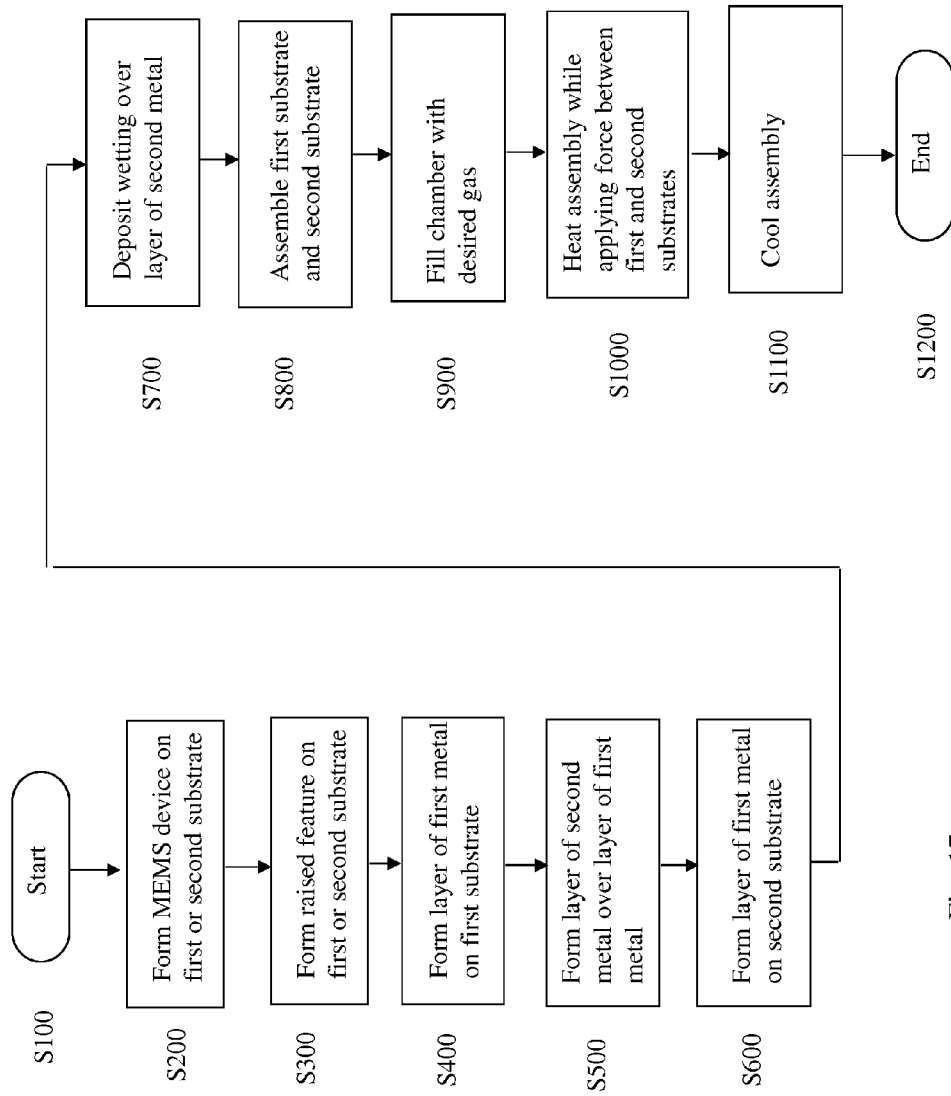
FIG. 17 is an exemplary embodiment of a method for manufacturing an encapsulated MEMS device with metal alloy substantially hermetic seal and keeper layer.

In the following discussion, FIGS. 2-10 depict exemplary embodiments of the SLID bonding system, and FIGS. 11-12 illustrate the use of a wetting layer; FIGS. 13-14 depict exemplary dimensions for the SLID bond; FIGS. 15-16 illustrate a set of design rules for selecting appropriate dimensions. FIG. 17 depicts an exemplary method for practicing the embodiment illustrated in FIGS. 11-12.

Figure 1:
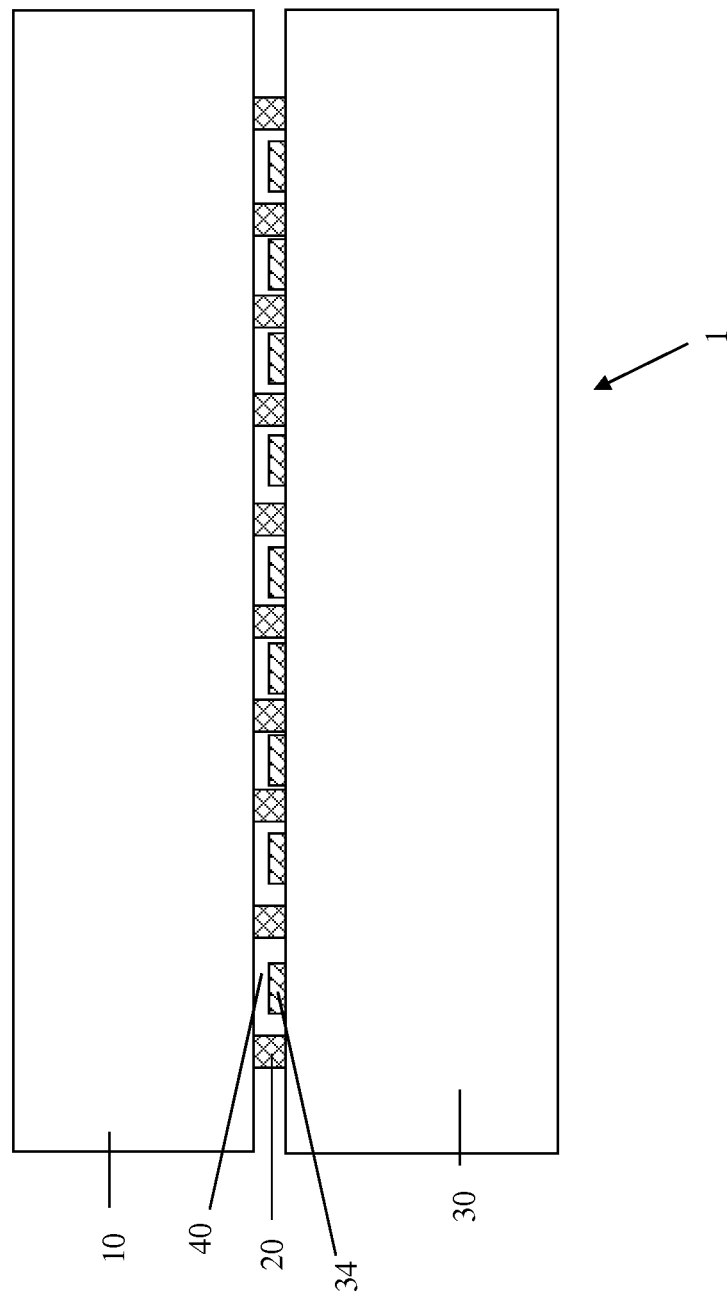
FIG. 1 is a cross sectional view of a prior art epoxy seal.
Figure 2:
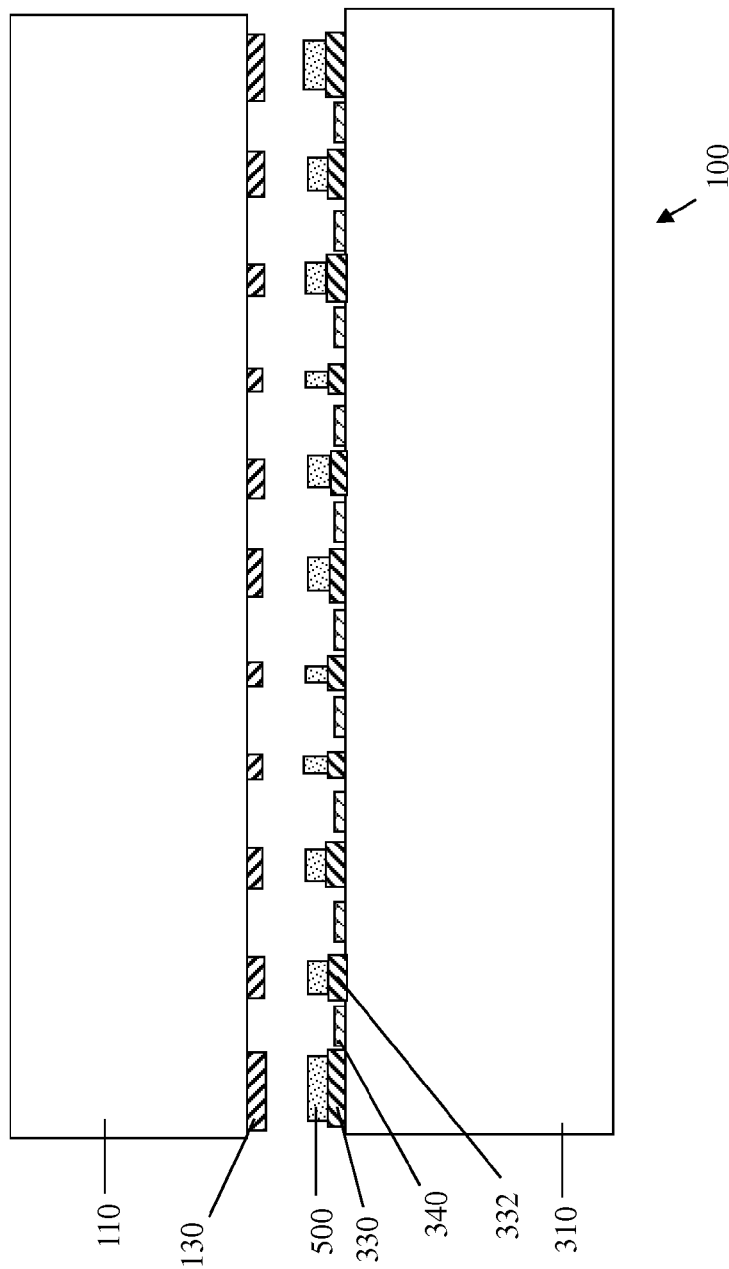
FIG. 2 is a cross sectional view showing an exemplary two-metal substantially hermetic seal.

FIG. 2 shows a cross sectional view of an exemplary two-metal alloy sealed assembly 100 prior to formation of the substantially hermetic seal. As shown in FIG. 2, the assembly 100 may include a first metal layer 130 deposited on a first substrate 110. The first substrate 110 may be a cap or lid wafer. Another metal layer 330 may be deposited on a second substrate 310, where metal layer 330 may be the same metal material as metal layer 130. Another metal layer 500 may be of a second metal material, and may be deposited over metal layer 330 on the second substrate 310. The second substrate 310 may be any suitable substrate, such as a silicon-on-insulator (SOI) substrate, upon which a plurality of MEMS devices 340 have been previously fabricated. Because the details of the MEMS devices are not necessary to the understanding of this invention, the MEMS devices 340 are shown only schematically in FIG. 2, as well as in the figures to follow. It should be understood that while this description pertains to the encapsulation of MEMS devices, the systems and methods disclosed here may be applied to any devices that require encapsulation. The MEMS devices 340 may be located in areas between the metal layers, such as between metal layers 330 and 332 as shown schematically in FIG. 2. The MEMS devices 340 may be an integrated circuit or a MEMS device which will be encapsulated by a substantially hermetic bondline formed by the alloy.

The first substrate may be any suitable material, including, for example, amorphous silicon, crystalline silicon, glass, quartz, or sapphire. Metal substrates may also be used, such as Kovar, a nickel-iron-cobalt alloy or Invar, a 36/64 alloy of nickel and iron. Both metals have a coefficient of thermal expansion closely matching that of silicon, which may be advantageous in terms of minimizing stress on the bond between the second substrate 310 and the first substrate 110.

It should be understood that metal layers 130 and 330 may be multilayers, rather than a single layer of metal material. For example, layers 130 and 330 may include an additional layer of metal within layer 130 or 330, to promote adhesion of metal layer 130 or metal layer 330 to substrate 110 or 310, respectively. For example, if the layers 130 and 330 are a gold layers, they may also include a thin layer of chromium (Cr) which promotes adhesion of the gold layers 130 and 330 to the surface of the substrate 110. The chromium layer may be, for example, about 50 Angstroms to about 200 Angstroms in thickness. Furthermore, there may also be diffusion barrier layers present, to prevent the diffusion of the metal of the adhesion layer into metal layer 130 or metal layer 330. For example, the gold layers 130 and 330 may also include a thin layer of molybdenum, about 100 Angstroms in thickness, which prevents the diffusion of the chromium adhesion layer into the gold layer, which would otherwise increase the electrical resistance of the metal layer 130. The remainder of metal layer 130 may be gold, which may be, for example, 3000 Angstroms to about 5000 Angstroms in thickness.

As illustrated in FIG. 2, metal layers 130 and 330 may be made wider than metal layer 500, in order to accommodate the outflow of metal layer 500 when metal layer 500 is heated beyond its melting temperature. For example, metal layers 130 and 330 may be made about 200 µm wide, whereas metal layer 500 may be made only about 80 to about 150 µm wide. Accordingly, when metal layer 500 is melted, and placed under pressure between metal layers 130 and 330, it may flow outward from the bond region. By making metal layers 130 and 330 wider than metal layer 500, the outflow of metal layer 500 may be accommodated while still keeping metal layer 500 between metal layer 130 and metal layer 330.

Described below are design rules for choosing the dimensions of metal layer 500 to reduce or eliminate the outflow of the metal from the bondline region. These design rules are discussed with respect to FIGS. 15 and 16.

The surfaces of metal layers 500 and 130 may be cleaned to prepare the surfaces for bonding, and to enhance the strength of the alloy bond. The cleaning procedures may include ion milling of the surfaces, or dipping substrate 110 with metal layer 130, and substrate 310 with metal layers 330 and 500 into a solution of hydrochloric acid (HCl) or nitric acid. The hydrochloric or nitric acid may be used for the removal of the self-passivated metal oxide surface formed over the metal layers 130, 500 and 330. Oxygen plasmas may be used to remove residual photoresist left over from the previous processing, or any other organics which may otherwise interfere with the formation of the alloy bond. The oxygen plasma treatment may be performed before the acid dip.

Alternatively, the surface of layer 500 may be treated with the deposition of a wetting layer described below with respect to FIGS. 11-12. The wetting layer may be a thin layer of organic material which removes oxides and improves the heat transfer between layer 130, 330 and 500.

Figure 3:
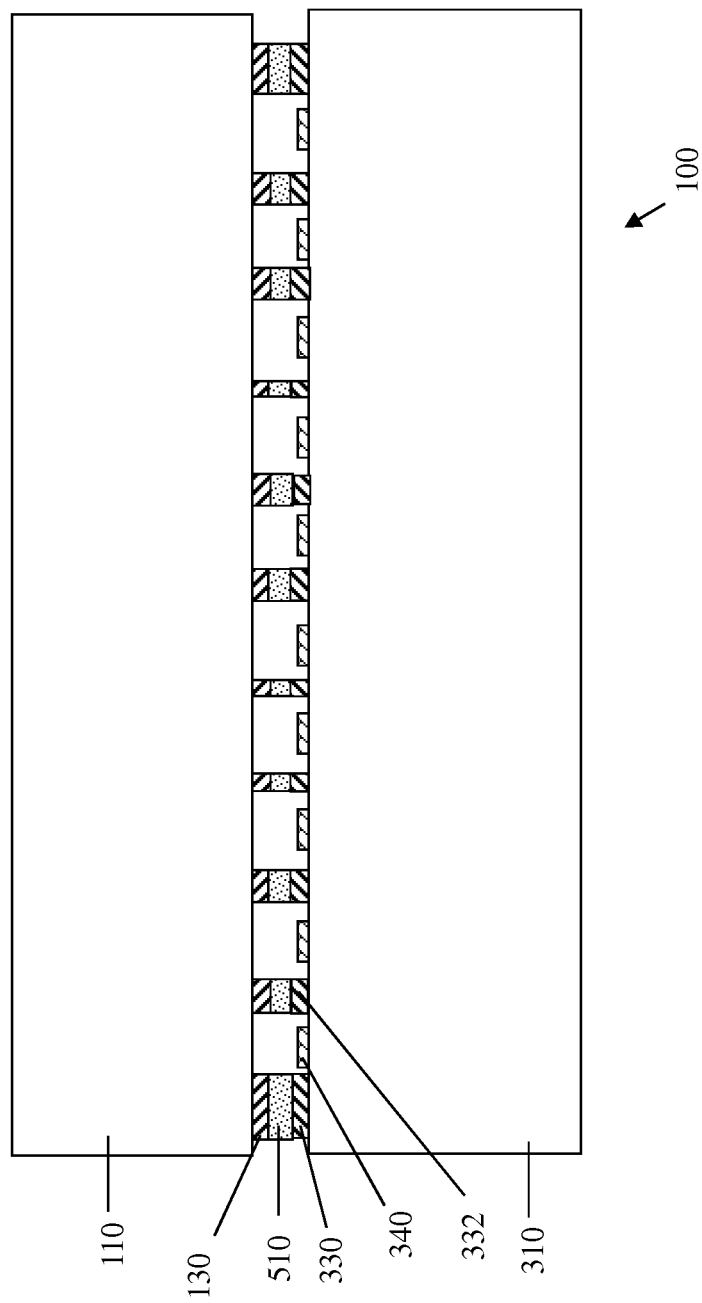
FIG. 3 is a cross sectional view showing an exemplary two-metal substantially hermetic seal after formation of the metal alloy bond.

The material of metal layers 130, 500 and 330 may be chosen such that metal layers 130, 500 and 330 may form an alloy 510, as shown in FIG. 3. The alloy 510 may have a much higher melting point than the material of either metal layer 130, 330 or metal layer 500. The alloy 510 is formed by heating the assembly 100 beyond the melting point of the materials of either or both metal layer 130 and 330 and/or metal layer 500. Since the alloy 510 of metal layer 130 and 330 and metal layer 500 may have a melting point much higher than the original metal material of metal layer 130, 330 or metal layer 500, the alloy 510 may quickly solidify, sealing MEMS devices 340 in a substantially hermetic seal. Exemplary environments which may be sealed in the MEMS cavity by the hermetic seal include substantially thermally or electrically insulating gases, such as $SF_6$, $CCl_2F_2$, $C_2Cl_2F_4$, Ar and $N_2$, and vacuum and partial vacuum.

By "substantially insulating," it should be understood that the gas environment has less than 50% of the electrical or thermal conductivity of 1 atmosphere of air at room temperature. By "substantially hermetic," it should be understood that the bond may be a large though not perfect barrier to the transmission of particles and gases across the bondline. For example, leak rates of less that about 1 Torr/hour into the approximately 25 uliter volume of the device cavity is considered to be "substantially hermetic." In addition, the substantially hermetic bondline may be understood to be impenetrable by particles of about 1 um or greater, in diameter.

In one exemplary embodiment, the first metal layer 130 and third metal layer 330 are gold (Au) and the second metal layer 500 is indium (In). The thicknesses of the gold layers 130 and 330 to the indium metal layer 500 may be in a ratio of about one-to-one by thickness. Since gold is about four times denser than indium, this ratio ensures that there is an adequate amount of gold in layers 130 and 330 to form the gold/indium alloy $AuIn_x$, where x is about 2, while still having enough gold remaining to ensure good adhesion to the substrates 110 and 310. The gold/indium alloy $AuIn_x$ 510 may have a much higher melting point than elemental indium 500, such that upon formation of the alloy 510, it quickly solidifies, forming the hermetic bond. For example, the melting point of the gold/indium alloy may be 540 degrees centigrade, whereas the melting point of elemental indium is only 156 degrees centigrade.

Gold diffuses slowly into indium at room temperature and will diffuse fully into the indium at a temperature well below the melting temperature making the alloy $AuIn_x$ which will not melt below 400 degrees centigrade. Care may therefore be taken to process and store the assembly at low temperatures to prevent the bond from forming before intended. The device and method described in U.S. Pat. No. 8,343,791 and incorporated by reference in its entirety, may address this issue by adding a diffusion barrier layer to the metals to prevent premature alloying. And allow the components to be heated beyond the melting temperature of the indium for a substantial period of time before bonding.

Upon heating the assembly 100 to the process temperature exceeding the melting point of indium (156 degrees centigrade), the indium becomes molten. Substrate 110 may then be pressed against substrate 310 in order to encourage the mixing of the molten indium 500 with the gold layers 130 and 330. In order to avoid squeezing all the molten indium out from the bond region by the pressing force, a standoff may define a minimum separation between substrate 110 and substrate 310.

Figure 4:
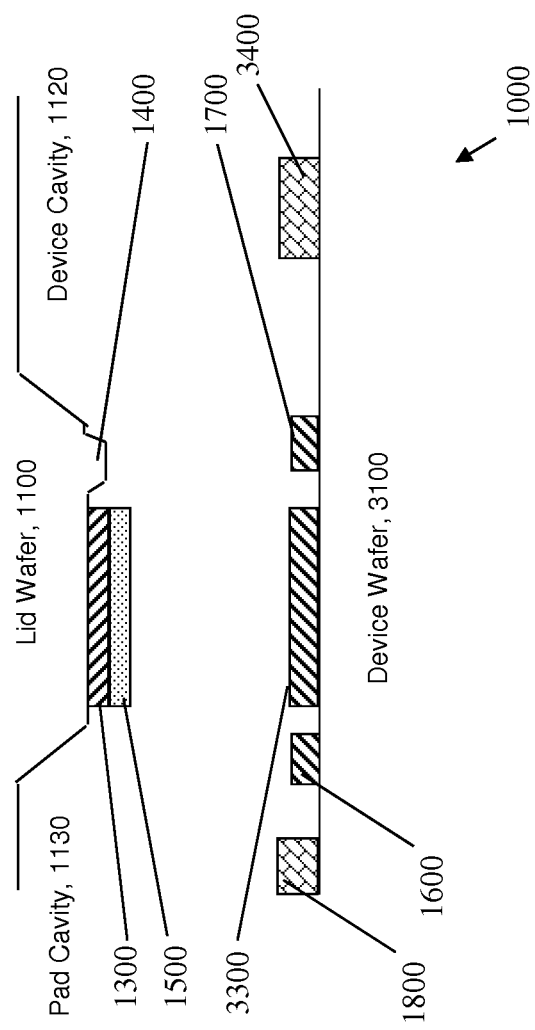
FIG. 4 is a cross sectional view showing a first embodiment of the wafer bond using two metal layers and a standoff on the lid wafer.

FIG. 4 is a cross sectional diagram of a more detailed view of the bond region 1000 of one of the devices similar to that shown in FIG. 2, according to one exemplary embodiment which includes a standoff 1400. The standoff 1400 may be formed in the lid wafer prior to depositing the metal films. The standoff 1400 may be formed by depositing and patterning photoresist over the area corresponding to the standoff, and etching the remaining surface of the lid wafer to a depth of about 2 to about 3 μm. After stripping and re-depositing the photoresist to cover the entire bonding region, the deeper cavities may be etched. These deeper cavities may include the device cavity 1120 and the pad cavity 1130. The device cavity 1120 provides clearance for the MEMS device 3400 to move, whereas the pad cavity 1130 provides clearance for external bonding pads such as pad 1800. Although not shown in this simplified view, the external pad 1800 may provide electrical access to the MEMS device 3400. The pad cavity 1130 over the pad 1800 may provide clearance for later sawing of the lid wafer to expose the bond pad 1800, which allows probing of the device 3400 before it is separated from the device wafer 3100.

After formation of the standoff 1400, the lid wafer 1100 may be plated with the bonding agents, a first layer of a first metal and a second layer of a second metal. In one exemplary embodiment, the lid wafer 1100 is plated with about 2.5 μm of gold 1300, followed by about 4 to about 5 μm of indium 1500. In addition, the device wafer 3100 may be plated with a third layer of the first metal. In this exemplary embodiment, the device wafer 3100 is plated with about 6 μm of gold 3300. It should be understood that the thicknesses disclosed above are exemplary only, and that other thicknesses may be chosen depending on the requirements of the application, as long as the thicknesses are appropriate for the formation of the metal alloy 200. Two additional gold features 1600 and 1700 may be formed at the same time as gold layer 3300. These additional gold features 1600 and 1700 may provide a dam on either side of the bond region, to confine the molten indium and prevent it from either flowing into and interfering with MEMS device 3400 or with external pad 1800. The assembly 1000 may then be heated to about 180 degrees centigrade, in order to melt the indium layer 1500 and form the gold/indium alloy 510. To assist in the formation of the gold/indium alloy 510, the lid wafer 1100 and the device wafer 3100 may be pressed together at a pressure of about 1 atmosphere. The alloy 510 may immediately solidify, forming the hermetic seal around the MEMS device. The assembly 1000 may then be cooled to room temperature.

Figure 5:
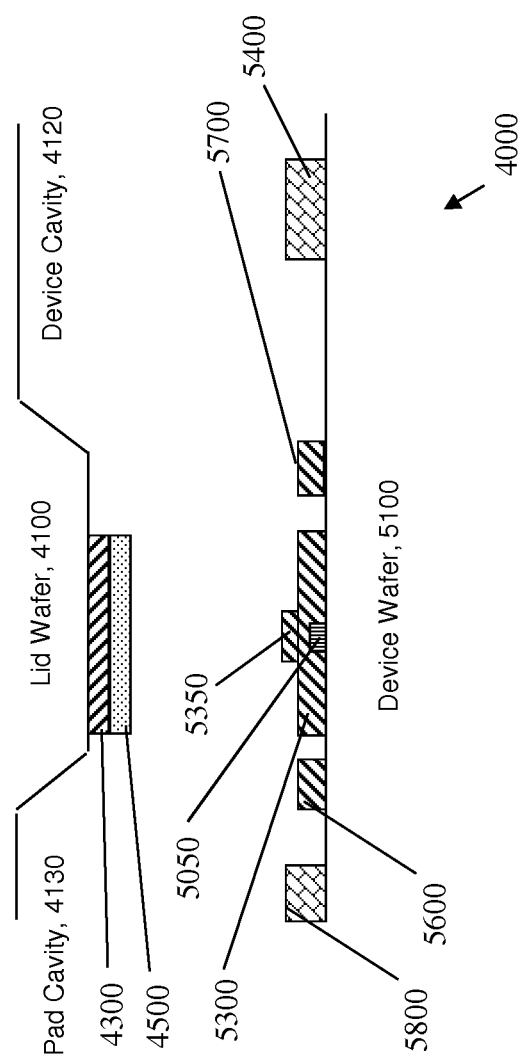
FIG. 5 is a cross sectional view showing a first embodiment of the wafer bond using two metal layers with a raised feature within the bondline on the device wafer.

FIG. 5 shows an exemplary embodiment 4000 which does not use the standoff 1400. Instead, in the embodiment 4000 shown in FIG. 5, a raised feature 5050 is deposited on the device wafer 5100, before deposition of the gold layer 5300. As used herein, the term "raised feature" refers to a feature which protrudes beyond the mating surfaces of the device, establishes a minimum separation between the surfaces of the device wafer 5100 and the lid wafer 4100, and over which at least one bonding agent may be deposited. The presence of raised feature 5050 produces a corresponding raised feature 5350 of the bonding agent, which here is a gold layer 5300, deposited conformally over the surface of the device wafer 5100 and the raised feature 5050. The resulting raised feature 5350 of the gold layer 5300 may enhance the formation of the alloy bond between the two substrates, the device wafer 5100 and the lid wafer 4100, as described further below. A second layer of a second metal, here an indium layer 4500, may be deposited over a third layer of the first metal, here a gold layer 4300. The second layer 4500 and third layer 4300 may be deposited on the second substrate, which here may be the lid wafer 4100.

Figure 6:
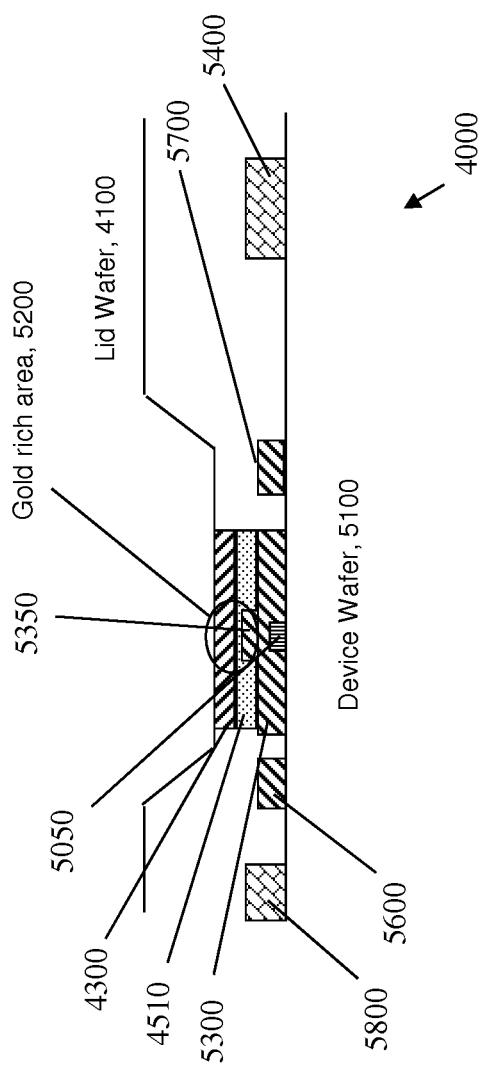
FIG. 6 is a cross sectional view showing a first embodiment of the wafer bond of FIG. 5 after the device wafer and lid wafer are brought together.

As the device wafer 5100 is brought toward the lid wafer 4100 during processing, the raised feature 5350 of the gold layer 5300 penetrates the molten indium layer 4500, until it touches or nearly touches the opposing gold layer 4300. FIG. 6 shows the embodiment of FIG. 5 after the device wafer 5100 and the lid wafer 4100 are brought together, with the raised feature 5350 of the gold layer 5300 penetrating the indium layer 4500. Since the indium layer 4500 is molten, it is free to flow out of the bondline region until the mating surfaces of the device wafer 5100 and the lid wafer 4100 reach the minimum separation defined by the raised feature 5350 in the gold layer 5300. Therefore, the raised feature 5350 may serve the same function as the standoff 1400 in the embodiment shown in FIG. 4.

Since most of the molten indium 4500 may have been squeezed out of the region between the raised gold feature 5350 and the gold layer 4300, this region may form a gold-rich area 5200 for formation of the gold/indium alloy which is likely to have a stoichiometry $AuIn_x$ wherein x is less than 2. In other regions further from the raised gold feature 5350 and gold-rich area 5200, the stoichiometry of the gold/indium alloy may be relatively indium-rich and gold poor, and may be likely to form an alloy $AuIn_x$ wherein x is greater than two. Between these two regions, there is likely to be a region of near-perfect stoichiometry, that is, where the stoichiometry of the alloy is nearly $AuIn_2$, which may be the desired alloy. More generally, using the raised feature, an alloy formed of at least two metals may have a predefined stoichiometry in at least two regions on either side of a midpoint of the raised feature. The predefined stoichiometry may be the eutectic alloy, for example, or the stoichiometry with some other preferred characteristics, such as a target density or target melting point, or target chemical composition, or a target mechanical or electrical property. These regions may allow the alloy 4510 to form a hermetic seal, sealing the device 5400 from the ambient environment. Therefore, by forming the raised feature 5050 below the metal layer, at least one region of the proper stoichiometry is more likely to form, and thus create the desired hermetic seal.

The profile described above, with a gold-rich region and a gold-poor region, may be symmetric about the centerline of raised features 5050 and 5350, resulting in at least two regions of the proper stoichiometry each adjacent to the gold-rich region 5200, and therefore forming a double seal about the centerline in the example.

The raised feature 5050 may be made of any material which has suitable mechanical competency, that is, a material which maintains its rigidity at a process temperature of about 200 degrees centigrade, and does not otherwise react with the gold or indium. For example, the raised feature 5050 may be formed of a metal such as an earlier plated gold (Au), nickel (Ni), chromium (Cr), copper (Cu), tungsten (W), molybdenum (Mo), titanium (Ti) layer, an inorganic dielectric layer, silicon nitride, poly silicon, amorphous silicon, spin-on glass (SOG), a spin coated, temperature tolerant polymer, polyimide, photoresist, or benzocyclobutene (BCB). In one embodiment, copper (Cu) is deposited by electroplating to a thickness of about 3 µm to about 6 µm. Copper is chosen in this embodiment for convenience, and may be deposited simultaneously with other copper features such as sacrificial layers located beneath the movable MEMS device 5400. In general, the thickness (or height) of the raised feature 5050 may be on the order of the thickness of the second metal layer, here the indium layer 4500, so as to penetrate through or nearly through the second metal layer. In general, the height of the raised feature may be between about 3 µm and about 6 µm tall. For example, the thickness (or height) of the raised feature 5050 may be about 4.8 µm and the thickness of the indium layer about 5.3 µm. The width of the raised feature may be between about one-quarter and about one-half of the width of the metal layers 4300, 4500 and 5300, which form the bondline. In one exemplary embodiment, the width of the raised feature is about 20 µm to about 40 µm, and the width of layer 4500 of the bondline is about 80 to about 150 µm before melting, and the width of metal layers 4300 and 5300 are about 200 µm. The thickness of the first layer of the first metal, here gold layer 5300, may be about 6 µm. The thickness of the second layer of the second metal, here indium 4500, may be about 4 to about 6 µm, and the thickness of the third layer of the first metal, here gold layer 4300, may be about 2.5 µm. The total thickness of the resulting alloy 4510 may be about 4 µm to about 6 µm thick.

The embodiment shown in FIG. 5 may have the advantage that no standoff 1400 needs to be formed on the lid wafer, which eliminates the process steps described above for the formation of this feature. In addition, comparison of FIG. 4 with FIG. 5 reveals that the elimination of the standoff 1400 may also reduce the area on the wafer that must be dedicated to the bonding operation. Also, by assuring the proper stoichiometry of the $AuIn_x$ alloy in at least one two regions, an effective hermetic seal may be formed. In fact, testing of devices made according to the embodiment illustrated in FIG. 5, compared to the embodiment shown in FIG. 4, an improvement in die yield hermeticity from about 80% to about 95% was realized.

This improved hermetic seal may be much more resistant to temperature cycling compared to the seal made by the embodiment illustrated in FIG. 4, because the bondline is inherently soft and ductile, and a double seal is formed about the raised feature 5350 centerline. Section photos of the design made according to the embodiment shown in FIG. 6 show cracks that appear to propagate along the length of the bondline at perhaps some undesired stoichiometry. The cracks were not seen to propagate across the raised feature 5350.

Since the height of the raised feature 5050 is controlled by sputtering, electroplating, lithographic or other uniform deposition method, the minimum separation between the substrates 4100 and 5100 may be controlled very tightly. Because the height of the raised feature 5050 and 5350 (4.8 µm) is nearly the same as the thickness of the indium layer (5.3 µm), the raised feature may effectively divide the volume of indium, leaving a relatively small volume of residual molten indium between the raised feature 5350 and the gold film 4300, which is susceptible to squeeze-out from between the bondlines. This smaller squeeze-out volume may make the bonding operation more reliable and more repeatable.

To further confine the flow of indium, the embodiment in FIG. 5 may also have a pair of gold features 5600 and 5700 on either side of the bond line, which serve as dams to impede the flow of molten indium into the device cavity 4120 or the pad cavity 4130 areas. These features may perform a function similar to features 1600 and 1700 in the exemplary embodiment shown in FIG. 4.

Figure 7:
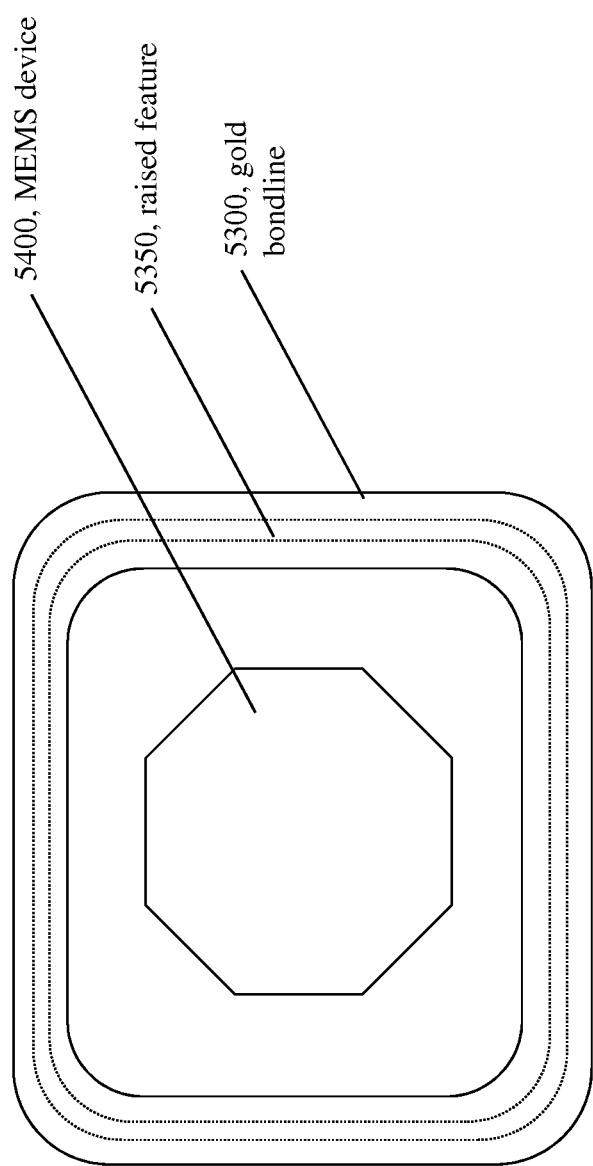
FIG. 7 is a plan view showing the first exemplary embodiment of the wafer bond using two metal layers with a raised feature on the device wafer.

FIG. 7 shows a plan view of the exemplary embodiment shown in cross section in FIG. 5. As shown in FIG. 6, the raised feature may completely circumscribe the MEMS device 5400 as a continuous perimeter. Alternatively, the raised features may only exist in certain portions around the perimeter of the device, such as in a series of raised pads or protrusions rather than a raised line. Raised pads rather than a raised line completely circumscribing the device may have the advantage that the gases are free to enter and exit the device cavity during fabrication. This may be convenient, as the pressure differential across the raised features may be allowed to equilibrate before the hermetic seal is made, and the desired gas may be allowed to completely replace the ambient gas around the MEMS device 5400 before sealing.

Figure 8:
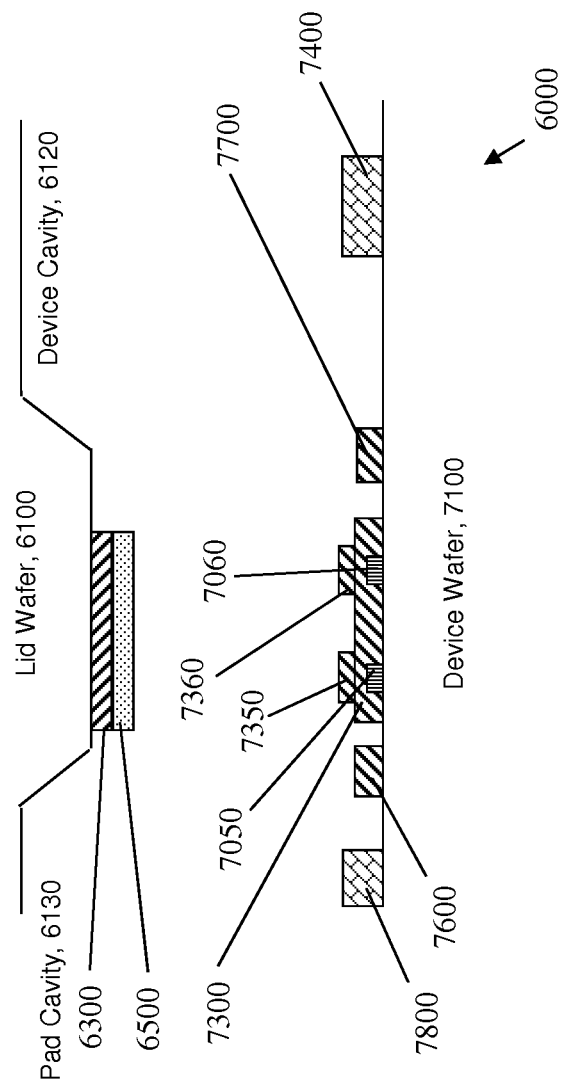
FIG. 8 is a cross sectional view showing a second embodiment of the wafer bond using two metal layers with a raised feature within the bondline on the device wafer.
Figure 9:
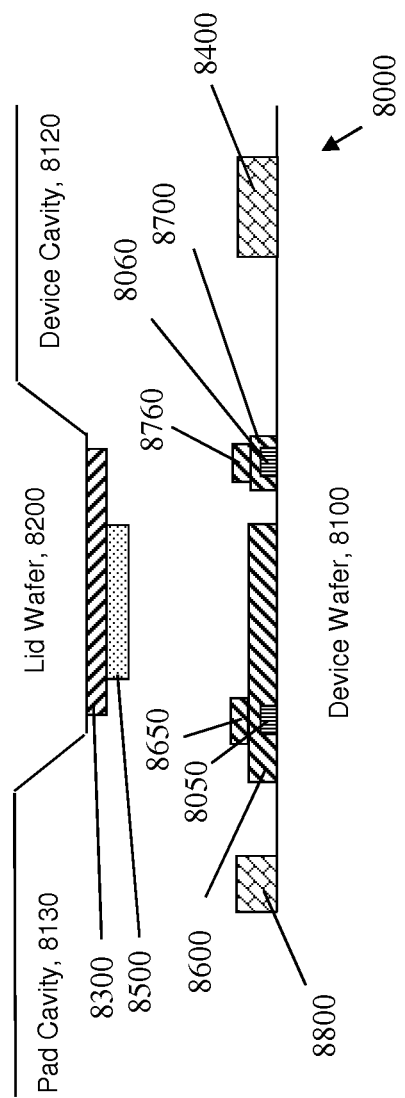
FIG. 9 is a cross sectional view showing a third exemplary embodiment of the wafer bond using two metal layers with a raised feature within the bondline on the device wafer.

FIG. 8 shows a second embodiment 6000 of the metal alloy hermetic seal using the raised features. As shown in FIG. 8, there may be more than one raised feature around the perimeter of the device, such as the two raised features 7050 and 7060. Like the first embodiment shown in FIGS. 5 and 6, the raised features 7050 and 7060 may be formed of a sacrificial material, which may be, for example, copper electroplated on the surface of the device wafer 7100. The presence of raised features 7050 ad 7060 cause two corresponding raised features, 7350 and 7360 to be formed upon deposition of the conformal gold layer 7300 over the raised features 7050 and 7060. As before, the bondline may include another electroplated gold layer, 6300, as well as an electroplated indium layer 6500. Although two raised features 7050 and 7060 are shown in FIG. 8, it should be understood that this is exemplary only, and that any number of additional raised features may be used. Also, it should be understood that the raised features may completely circumscribe the device as shown in FIG. 7, or the raised features may be distinct, and form, for example, a series of raised protrusions. Also as before, two additional gold features 7600 and 7700 may serve as dams to block the flow of molten indium into the device cavity 6120 or the pad cavity 6130. As with the previous embodiments, the raised features 7350 and 7360 may penetrate the layer of molten indium 6500, to provide at least two locations for each raised feature wherein the ratio of gold to indium is the preferred 1 to 2, to form the preferred alloy, $AuIn_2$.

FIG. 10 shows a fourth embodiment 9000 of the metal alloy bond with the raised feature. In the fourth embodiment 9000, the raised feature 9050 is placed on the lid wafer 9200, rather than the device wafer 9100. In this embodiment, all the other aspects of the design, such as layer thicknesses, and widths of the raised feature may be the same as in the first embodiment illustrated in FIG. 5. In addition, there may be a plurality of raised features formed on the lid wafer 9200, rather than just the one shown in FIG. 10. The presence of the raised feature 9050 then causes a raised feature 9350 to be formed in the overlying gold layer 9300, and then a corresponding raised feature 9550 to be formed in the indium layer 9500 deposited over the gold layer 9300 and raised feature 9350 on the lid wafer 9200.

When the indium layer 9500 becomes molten during processing and the device wafer 9100 is pressed against the lid wafer 9200, the raised feature 9350 of the gold layer 9300 protrudes through the molten indium 9500, until it touches or nearly touches the gold layer 9700 deposited on the device wafer 9100. Therefore, the raised gold feature 9350 performs a similar function to the raised feature 5350 in FIG. 5, that is, to put two gold-rich regions in close proximity to each other by penetrating the molted indium layer, thereby creating a spectrum of stoichiometries from gold-rich to indium-rich/gold poor. The raised feature 9050 thereby helps to ensure that there are at least two regions symmetric about each raised feature within the spectrum of stoichiometries, wherein the ratio of gold-to-indium is appropriate for forming the preferred stoichiometric alloy, $AuIn_2$. This region may form the hermetic seal around the MEMS device.

Because the metal layers are generally formed in a vacuum deposition chamber, removed, and inserted into a wafer bonding chamber for bonding, they may be exposed to atmosphere for a period. During this period, the metal layers may become oxidized, and contaminants may adhere to them. These contaminants and oxides may interfere with the formation of a uniform alloy at during the bonding process described previously.

A wetting layer of an organic compound may be applied to especially the second, lower melting point metal layer. While the organic compound may be inert at room temperature, it may be strongly reducing at the bonding temperature, removing metal oxides from the surface of the metal layer. The removal of these oxides may then facilitate wetting by molten metal. The wetting layer may further act as an oxygen barrier by coating the hot surface, preventing its further oxidation. Finally, the wetting layer may serve as a heat transfer medium, facilitating heating of the interface between the two metal layers.

The wetting layer may be an organic compound, having a medium molecular weight of between about 100 amu and about 400 amu. It may have a strong affinity for the metal surface, and this affinity may be enhanced by using an organic compound with polar end groups, such as —OH, —COOH, NH2, or —SH. The backbone of the organic compound may be straight-chained or branched. The carbon backbone may be at least 7 carbon atoms long. Some exemplary organic compounds having these features are 1-octanol $CH_3(CH_2)_7OH$ at 130 amu, 1-nonanol $CH_3(CH_2)_8OH$ at amu 144, and 1-decanol at amu 158.

The wetting layer may be deposited by vapor phase deposition, wherein the substrate to be coated is placed in a chamber with a partial pressure of the organic material of about 1 Torr by heating the organic material to a temperature that promotes volatilization. Alternatively, the organic layer may be deposited by solution deposition, wherein the substrate is immersed in an appropriate solvent containing the organic material as a solute. The wafer is then withdrawn slowly with minimal vibration to permit the solvent to evaporate from the surface of the substrate as it is withdrawn.

It is preferred that the attachment mechanism of the organic layer to the metal surface be physisorption rather than a stronger, covalent bond. When the compound is only loosely physisorbed, it may be readily driven off or evaporated during the bonding, leaving little or no residue that may interfere with the formation of the alloy.

The thickness of the organic layer may be thick enough to completely cover the metal surface, but thin enough to be entirely driven off by evaporation during bonding. The thickness of the metal layer may be about 5 um with a root mean square roughness of about 10 nm. The wetting layer may therefore be between a monolayer (1 nm) and three times the rms roughness or about 30 nm.

FIG. 11 is a simplified schematic diagram of the device using the wetting layer. A first layer of a first metal 4300, for example the solid component of the SLID bond, may be deposited on the surface of a substrate 4100. This layer may then be covered by a second layer of a second metal 4500, for example the lower melting temperature component of the SLID bond. These layers may be deposited as described previously with respect to FIG. 5. Then, the wetting layer 4200 of an organic material may be deposited using any of the techniques described above. The organic material may be 1-nonanol, for example.

The other substrate 5100 may have the raised feature 5050 deposited on it, and over that, another layer 5300 of the first metal. Because the layer 5300 may be deposited conformally, there may be a corresponding raised feature 5350 in the layer 5300. The substrates may then be brought together and heated to the melting point of the second metal 4500. Because the organic material is liquid at room temperature and above, the liquid material may fill small gaps caused by the finite roughness of the two surfaces in contact that would otherwise be voids. The presence of the organic material may improve the thermal coupling between the two surfaces, such that the bonding temperature is achieved evenly. This increased thermal contact allows for improved uniformity and decreased latency of alloy formation.

FIG. 12 is a simplified cross sectional view of the device after bonding. As can be seen in FIG. 12, the raised feature 5350 now penetrates the second layer of the second metal 4500, which is now almost or completely alloyed 4510 with the first metal 4300. Although the location of the wetting layer 4200 is indicated by a line between the alloy 4510 and the first metal on the second substrate 5300, it should be understood that the wetting layer has been largely or entirely driven off or volatilized during the bonding, and that little or no residual organic material may remain at the location indicated by reference number 4200.

Accordingly, the method using the wetting layer may include forming a first layer of a first metal on at least one of the first substrate and the second substrate, forming a second layer of a second metal adjacent to the first layer of the first metal, wherein the second metal has a lower melting point than the first metal. Then, the method may include forming at least one raised feature protruding from a bonding surface and into at least one of the first layer and the second layer, and forming a wetting layer of an organic material on at least one of a first substrate and a second substrate and adjacent to the lower melting point second metal. The substrates may be bonded by hermetically coupling the first substrate and the second substrate with a bondline of an alloy formed from the first metal and the second metal wherein the wetting layer is driven off at the temperature of alloy formation.

During bonding, the method may further include heating the substrates so that the second layer is wetted by the wetting layer, then cleaning the second layer with the organic material, and finally bonding the first substrate and the second substrate with the alloy while driving off the wetting layer.

It should be understood that the simplified cross sectional diagram of FIGS. 11, 12 and others may not be drawn to scale. For clarity of depicting the disposition of the wetting layer 4200 it is shown far larger in comparison with the metal layers than it actually is. It should also be understood that the wetting layer may be applied to the second metal in any of the foregoing embodiments, so applied to metal layer 500, 1500, 4500, 6500, 8500 or 9500, in FIGS. 2, 4, 5, 8 and 9, for example.

FIG. 13 shows an exemplary embodiment using the design guidelines set forth above, which may be used to form a hermetic bondline with high yield in a volume production setting. This embodiment is characterized by the metal layer widths $W_1$ for the width of the first metal 4300, $W_2$ for the width of the lower melting point second metal 4500, $W_m$ for the width of the raised feature 5050. In this embodiment, both layers of the first metal 4300 and 5300 have the same width $W_1$, but this need not necessarily be the case. The thicknesses of these respective layers are $T_1$, $T_2$ and $T_m$ for the raised feature. The raised feature 5050 and first layer 5300 of a first metal may be formed on a device wafer 5100, whereas the second metal 4500 and another layer 4300 of the first metal may be formed on a lid wafer 4100, or vice versa.

The raised feature 5050, which in this embodiment may be photoresist or copper, may have a width of about 20 μm wide for dimension $W_m$. A first metal layer 5300, in this embodiment a layer of gold, may be formed with a width of about 120 μm for dimension $W_1$. The raised feature 5050 may be located at approximately the midpoint of the bondline as shown in FIG. 13. A second metal layer 4500, in this embodiment a layer of indium, may be formed with a width of about 80 μm on a lid wafer for dimension $W_2$. The second layer of the first metal 4300 on the lid wafer 4100 may have the same width, 120 μm, as the first layer 5300, or $W_1$. The thicknesses ($T_1$, $T_2$, $T_m$) of the various layers 4300, 4500, and 5050 may be about the same, for example, about 5 μm. Alternatively, the thicknesses of the various layers may be different, depending on the application or the stoichiometry of the desired alloy.

From the symmetry of FIG. 13, is should be understood that layers 4300 and 4500 may also be formed on the device wafer, and layers 5050 and 5300 may be formed on the lid wafer. Because the second metal is molten at bonding, it is clear from FIG. 13 that care must be taken to prevent the molten metal from leaking out of the bondline area and into the laterally surrounding region, where it may interfere with the functioning of an adjacent device. In order to avoid this outcome, a larger amount of surface area on the wafer may be attributed to the bondline, which will reduce the wafer utilization efficiency. By adhering to the design guidelines set forth below with respect to FIGS. 15 and 16, the likelihood of this leakage may be minimized.

FIG. 14 shows additional detail of the function of the raised feature within the bondline. In FIG. 14, it can be seen that the formation of alloys of varying stoichiometry along the bondline may result in voids 5060 being created within the bondline. That is, some alloys may have higher densities than the original elemental indium, and thus a void may be created upon formation of that alloy. The voids may form as the molten indium is pulled into the regions where the alloy is created. Because of concern about the molten metal leaking into surrounding areas, a slight deficiency of the second metal 4500 may be the intent of the design. These voids may provide a leak path for gases to enter or exit the device cavity, and thus the device is not hermetically sealed within the device cavity. The formation of such voids has made the low temperature alloy bonding process difficult to implement in a volume production setting, where yields generally need to exceed 90%. It is specifically the presence of these voids in the alloy bondline profile that the raised feature addresses, and it is the tendency of leak paths to form in alloy layer 4510 that the raised feature resolves. The presence of the raised feature assures that the proper stoichiometry occurs at least at two points on either side of the raised feature and thus prevents leaks.

In the presence of the raised feature 5050, the bondline may be completely solid along paths from all points inside the device cavity to a point external to the device cavity, because of the range of stoichiometries created adjacent to the raised feature 5050. The resulting bond may be hermetic if the raised feature forms a substantially continuous perimeter, for example a perimeter extending at least 250 degrees around the device, or at least a large portion of a perimeter. That is, with the use of the raised feature, a substantially hermetic, non-leaking bond may be formed around the device 4000, at low temperatures less than about 200 degrees centigrade. The hermetic seal is formed from the alloy material which adheres the two non-melting surfaces and fills any gaps therein, while leaving voids in areas laterally beyond the area of penetration of the raised feature.

Finally, it appears that immediately following the deposition, for example, after the electroplating of the indium (In) on the gold (Au), the In diffuses into the Au at room temperature, but the diffusion is slowed by orders of magnitude by the formation of at least one void 5060 between the partially alloyed Au and the pure indium, and adjacent to the raised feature. This void is shown in FIG. 14, and the midpoint 5055 of the raised feature is also shown in FIG. 14. In general, a pair of voids 5060 may be formed in at least two locations on either side of a midpoint of the raised feature. The voids occur because at room temperature the indium self-diffusion is too slow to replenish the indium at the interface. Not until the pure indium is melted does the gap fill and the diffusion resume. This feature is important because it may allow a lengthy period, at least several hours and possibly as much as one to two days, of time between the deposition of the layers and the formation of the bond. This capability has important implications for the manufacturing process and the flow of work-in-progress through the manufacturing line, easing the pressure to perform the bonding soon after formation of the layers.

It should also be noticed that because of the presence of the raised feature 5050, concave areas exist adjacent to the raised feature that can accommodate the pooling of liquids as shown in FIGS. 14 and 15. These concave areas will also be referred to as the "wettable areas" when the bond is made, as discussed below with respect to FIG. 15. The concept of the wettable area 4900 is helpful in determining the dimensions of the second metal layer 4500 that are adequate to make the bond, but not excessive such that molten metal escapes the bondline and leaks into adjacent areas. This area allows liquid squeezed from the interface to collect in pools adjacent to the raised feature. Because of the affinity of the liquid component (indium) of the SLID bond to stay in proximity to its alloy partner, the solid component (gold) of the SLID bond, the indium tends to stay on the bondline rather than spreading over the substrate surface. These concave areas allow the liquid to collect. Nonetheless, some leakage of the second metal 4500 into the surrounding areas may be unavoidable without careful selection of the dimensions of the second layer of the second (lower melting temperature) component of the SLID bond. For proper selection of these dimensions, the concept of a "wettable volume" is helpful, and is explained below. It should be understood that despite the similar terminology, the wettable volume should not be confused with the wetting layer described above with respect to FIGS. 11 and 12. The wettable volume is a construct that can be used to select layer dimension for the second layer of the second metal, and this dimension may also determine the width of the wetting layer.

FIG. 15 illustrates the concept of the wettable volume, which is the volume of space available for holding the molten metal and for the formation of the alloy. The wettable volume of the bondline is defined by the envelope of the surfaces of the first metal after bonding, as this is the space that will contain the molten metal. This wettable volume is given by $V_w = L_w * T_w * W_w$ wherein $L_w$, $T_w$, and $W_w$ are the length, thickness and width of the wettable volume, respectively. But because all the components of the bondline have about the same length (the length being the length of the bondline perimeter around the device enclosed), it makes sense to talk in terms of a "wettable area" $A_w$ rather than a "wettable volume" $V_w$, and this wettable area is given by $A_w = T_w * W_w$.

As can be seen from FIG. 15, when the two substrates are brought together, the hard surfaces 4300 and 5300 are touching or nearly touching, and separated by about the thickness of the raised feature, $T_m$, the liquid metal may be pushed out of the way and into these adjacent wettable areas 4900 shown in FIG. 15. This wettable area also corresponds to the concave areas of FIG. 13 in the unbonded state. If the total amount of liquid can fit into this area, minimal leakage will occur during bonding. Accordingly, the wettable volume or the wettable area could be understood as the volume or area defined by the surfaces of the first metal after bonding, where the first metal is the solid component of the SLID bond.

To the extent that the thickness of this wettable area 4900 is approximately the thickness of the raised feature so $T_w \sim T_m$, inspection of FIG. 15 reveals that this total wettable area $A_w$ is given by, approximately, $$A_w \sim (W_1 - W_m) * T_m \quad (1)$$

and the wettable areas 4900 are identified in FIG. 15.

So if no leakage is to occur the total area of the second layer of the second metal may not exceed the amount of wettable area given by eq. (1). The total area of the second layer is shown graphically in FIG. 16, as having a width $W_2$ and a thickness $T_2$. Therefore, these dimensions should be chosen such that the total area $A_2$ of the second layer is less than or equal to the wettable area. Mathematically, $$A_2 = W_2 * T_2 \leq A_w \quad (2)$$

Accordingly, the dimensions of the original second layer of the second metal $T_2$ and $W_2$ prior to bonding should be chosen such that $$A_2 = W_2 * T_2 \leq (W_1 - W_m) * T_m \quad (3)$$

in order to reduce or avoid leakage of the molten metal into the surrounding area.

FIG. 17 illustrates an exemplary embodiment of a method for manufacturing the device with wafer level hermetic bond using metal alloy with wetting layer. The method begins in step S100 and proceeds to step S200, wherein the MEMS device is formed on a first or second substrate. In step S300, a raised feature is formed. However, it should be understood that the raised feature may be formed simultaneously with, or even before, the MEMS device, or whenever it may conveniently be implemented in the process, before the metal layers are deposited and the substrates are bonded. The raised feature may be formed substantially in a perimeter around the device, and on either the first or the second substrate. In step S400, a layer of the first metal may be formed on the first substrates. If used, this first layer may be formed over the raised feature, or on the other substrate. In step S500, a second layer of a second metal is formed over the layer of the first metal. In step S600, a layer of the first metal is formed on the second substrate.

In step S700, a wetting layer of an organic material is formed over the second layer. In step S800, the first substrate is assembled with the second substrate by, for example, disposing their mating surfaces against one another, to form a two-wafer assembly. The bonding chamber may be evacuated in step S900, or the wafer bonding chamber may be filled with the desired gas. Exemplary environments include gases which are at least one of thermally insulating and electrically insulating, such as $SF_6$, He, $CCl_2F_2$, $C_2Cl_2F_4$, Ar and $N_2$, vacuum and partial vacuum.

In step S1000, the assembly is heated while applying force between the first and the second substrates. In step S1100, the assembly is cooled to form the hermetic seal around the MEMS device. The process ends in step S1200.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes the formation of a gold/indium alloy, it should be understood that the systems and methods described herein may be applied to any number of different alloy systems, or solid-liquid interdiffusion bonding systems, in addition to $AuIn_x$. Furthermore, while a specific organic material for the wetting layer is described in the exemplary embodiments, it should be understood that other materials may be chosen, depending on the application. Although a method is disclosed for manufacturing the encapsulated MEMS device, it should be understood that this method is exemplary only, and that the steps need not be performed in the order shown, and may be adapted to produce any embodiment described herein or other embodiments encompassed. Accordingly, the exemplary implementations set forth above, are intended to be illustrative, not limiting.

What is claimed is:

1. A method for encapsulating a device with a seal comprising:
    forming a first layer of a first metal on at least one of a first substrate and a second substrate;
    forming a second layer of a second metal adjacent to the first layer of the first metal, wherein the second metal has a lower melting point than the first metal;
    forming at least one raised feature protruding from a bonding surface and into at least one of the first layer and the second layer;
    forming a wetting layer of an organic material on at least one of the first substrate and the second substrate and adjacent to the second layer of the lower melting point second metal, and
    bonding the first substrate and the second substrate with a bondline of an alloy formed from the first metal and the second metal wherein the wetting layer is entirely driven off by evaporation at a temperature of alloy formation.

2. The method of claim 1, further comprising:
    forming the raised feature before forming the first layer of the first metal or the second layer of the second metal on the at least one of the first and the second substrates.

3. The method of claim 1, further comprising:
forming at least one void adjacent to the raised feature.

4. The method of claim 1, wherein the bondline is substantially hermetic.

5. The method of claim 1, wherein the raised feature comprises at least one of gold (Au), nickel (Ni), chromium (Cr), copper (Cu), tungsten (W), molybdenum (Mo), titanium (Ti) layer, an inorganic dielectric layer, silicon nitride, poly silicon, amorphous silicon, spin-on glass (SOG), a spin coated, temperature tolerant polymer, polyimide, photoresist, and benzocyclobutene (BCB).

6. The method of claim 1, further comprising:
heating the substrates so that the second layer is wetted by the wetting layer;
cleaning the second layer with the organic material; and
bonding the first substrate and the second substrate with the alloy while driving off the wetting layer.

7. The method of claim 6, wherein the organic material comprises at least one of 1-octanol, 1-nonanol and 1-decanol.

8. The method of claim 1, wherein the organic material includes a polar end group chosen from —OH, —COOH, $NH_2$ and —SH.

9. The method of claim 1, wherein the organic material comprises a carbon backbone at least 7 carbon atoms long.

10. The method of claim 1, wherein the wetting layer is deposited to a thickness of at least a monolayer but less than about three times the root-mean-square roughness of the second layer of the second metal.

11. The method of claim 1, wherein the second metal is a liquid component of a solid/liquid interdiffusion bond (SLID) bond.

12. The method of claim 1, further comprising:
forming a device on at least one of the first and the second substrates, and encapsulating the device with the bondline in a device cavity, wherein the encapsulated device comprises at least one of an integrated circuit and a MEMS device.

13. The method of claim 12, wherein the device cavity includes an environment comprising at least one of $SF_6$, He, $CCl_2F_2$, $C_2Cl_2F_4$, Ar and $N_2$, vacuum and partial vacuum.

14. The method of claim 1, further comprising forming another layer of the first metal on another adjacent side of the second layer of the second metal.

15. The method of claim 14, wherein a wettable volume $V_w$ of the bondline is defined by an envelope of surfaces of the first metal after bonding.

16. The method of claim 15, wherein the wettable volume $V_w$ is given by $V_w = A_w * L$, where $A_w$ is the wettable area and L is a length of the bondline, and the wettable area $A_w = T_w * W_w$ wherein $T_w$ is the thickness and $W_w$ is the width of the wettable area.

17. The method of claim 1, wherein the alloy has a predefined stoichiometry in at least two locations on either side of a midpoint of the raised feature.

18. The method of claim 1, wherein the alloy is a solid/liquid interdiffusion bond (SLID) alloy.

19. The method of claim 18, wherein the first metal is gold (Au), the second metal is indium (In), and the alloy is $AuIn_x$, and wherein the predefined stoichiometry is $AuIn_x$ where x is about 2.

20. A method for encapsulating a device with a seal comprising:
forming a first layer of a first metal on at least one of a first substrate and a second substrate;
forming a second layer of a second metal adjacent to the first layer of the first metal, wherein the second metal has a lower melting point than the first metal;
forming at least one raised feature protruding from a bonding surface and into at least one of the first layer and the second layer;
forming a wetting layer of an organic material on at least one of the first substrate and the second substrate and adjacent to the second layer of the lower melting point second metal, and
bonding the first substrate and the second substrate with a bondline of an alloy formed from the first metal and the second metal wherein the wetting layer is entirely driven off by evaporation at a temperature of alloy formation,
and further comprising forming another layer of the first metal on the other adjacent side of the second layer of the second metal wherein a wettable volume $V_w$ of the bondline is defined by an envelope of surfaces of the first metal after bonding wherein the wettable volume $V_w$ is given by $V_w = A_w * L$, where $A_w$ is the wettable area and L is a length of the bondline, and the wettable area $A_w = T_w * W_w$ wherein $T_w$ is the thickness and $W_w$ is the width of the wettable area,
wherein the area of the second metal prior to bonding is $A_2$, and $A_2$ is less than or equal to the wettable area $A_w$, and $$A_2 = W_2 * T_2 \leq (W_1 - W_m) * T_m$$

where $W_1$ is the width of the first layer, $T_m$ is the thickness of the raised feature, and $W_m$ is the width of the raised feature, and $W_2$ and $T_2$ are the width and thickness of the second layer respectively, prior to bonding.

* * * * *